(12) United States Patent
Nishizato et al.

(10) Patent No.: US 10,927,462 B2
(45) Date of Patent: Feb. 23, 2021

(54) GAS CONTROL SYSTEM AND FILM FORMATION APPARATUS PROVIDED WITH GAS CONTROL SYSTEM

(71) Applicant: HORIBA STEC, CO., LTD., Kyoto (JP)

(72) Inventors: Hiroshi Nishizato, Kyoto (JP); Masakazu Minami, Kyoto (JP); Yuhei Sakaguchi, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 80 days.

(21) Appl. No.: 16/323,119

(22) PCT Filed: Jul. 26, 2017

(86) PCT No.: PCT/JP2017/026994
§ 371 (c)(1),
(2) Date: Feb. 4, 2019

(87) PCT Pub. No.: WO2018/025713
PCT Pub. Date: Feb. 8, 2018

(65) Prior Publication Data
US 2019/0161863 A1    May 30, 2019

(30) Foreign Application Priority Data
Aug. 5, 2016   (JP) .............................. JP2016-154928

(51) Int. Cl.
*C23C 16/52*     (2006.01)
*C23C 16/448*    (2006.01)
(Continued)

(52) U.S. Cl.
CPC ............ *C23C 16/52* (2013.01); *C23C 16/448* (2013.01); *G05D 7/0635* (2013.01); *H01L 21/67017* (2013.01); *H01L 21/67253* (2013.01)

(58) Field of Classification Search
CPC ... C23C 16/52; C23C 16/448; C23C 16/4481; H01L 21/67017; H01L 21/67253; G05D 7/0635
See application file for complete search history.

(56) References Cited

U.S. PATENT DOCUMENTS 7,883,581 B2 *   2/2011   Nakaiso ................ C23C 16/345
                                              118/715
7,975,718 B2 *   7/2011   Ngo .................... C23C 16/4485
                                              137/486
(Continued)

FOREIGN PATENT DOCUMENTS

CN          102156489 A      8/2011
CN          102541101 A      7/2012
(Continued)

OTHER PUBLICATIONS

International Search Report dated Oct. 31, 2017 issued in No. PCT/JP2017/026994, dated Oct. 31, 2017.
(Continued)

*Primary Examiner* — Ramesh B Patel
(74) *Attorney, Agent, or Firm* — Greenblum & Bernstein, P.L.C.

(57) ABSTRACT

The present invention provides a gas control system which introduces carrier gas into a tank containing a material and leads out material gas generated by vaporization of the material from the tank together with the carrier gas, the gas control system being provided with: a flow rate control unit that is configure to control the flow rate of the material gas led out from the tank by adjusting the flow rate of the carrier
(Continued)

gas introduced into the tank; and a control limit detection unit that is configured to detect a control limit state and output detection of the control limit state, the control limit state is a state that the adjustment of the flow rate of the carrier gas performed by the flow rate control unit cannot secure the flow rate control of the material gas at a predetermined performance level.

12 Claims, 5 Drawing Sheets

(51) Int. Cl.
  *H01L 21/67* (2006.01)
  *G05D 7/06* (2006.01)

(56) References Cited

U.S. PATENT DOCUMENTS

| | | | | |
|---|---|---|---|---|
| 8,459,291 | B2* | 6/2013 | Minami | G05D 11/138 |
| | | | | 118/689 |
| 8,931,506 | B2* | 1/2015 | Nagata | B01B 1/005 |
| | | | | 118/726 |
| 8,997,775 | B2* | 4/2015 | Woelk | B01D 7/00 |
| | | | | 137/110 |
| 10,138,555 | B2* | 11/2018 | Nishizato | C23C 16/4482 |
| 10,385,457 | B2* | 8/2019 | Yagi | C23C 16/52 |
| 10,655,220 | B2* | 5/2020 | Sakaguchi | C23C 16/4482 |
| 2004/0007180 | A1* | 1/2004 | Yamasaki | C23C 16/52 |
| | | | | 118/715 |
| 2004/0098210 | A1* | 5/2004 | Fujiwara | G01F 1/6845 |
| | | | | 702/45 |
| 2005/0252450 | A1 | 11/2005 | Kowalsky et al. | |
| 2008/0141937 | A1* | 6/2008 | Clark | C23C 16/16 |
| | | | | 118/697 |
| 2016/0097127 | A1 | 4/2016 | Lenz | |
| 2016/0273101 | A1* | 9/2016 | Komori | C23C 16/14 |

FOREIGN PATENT DOCUMENTS

| | | |
|---|---|---|
| CN | 104073781 A | 10/2014 |
| CN | 104947082 A | 9/2015 |
| JP | 4-345131 A | 12/1992 |
| JP | 4-354131 | 12/1992 |
| JP | 2006-222133 A | 8/2006 |
| JP | 2006-324532 A | 11/2006 |
| JP | 2008-218760 A | 9/2008 |
| JP | 2012-138406 A | 7/2012 |

OTHER PUBLICATIONS

China Office Action issued in Chinese patent application No. 201780048644.X, dated Sep. 23, 2020.

* cited by examiner

GAS CONTROL SYSTEM AND FILM FORMATION APPARATUS PROVIDED WITH GAS CONTROL SYSTEM

TECHNICAL FIELD

The present invention relates to a gas control system and a film formation apparatus provided with the gas control system.

BACKGROUND ART

A gas control system for transferring material gas used in a film formation treatment of a semiconductor manufacturing process is known that is configured, as shown in patent document 1, to introduce carrier gas into a tank in which a material is contained, to lead out material gas generated by vaporization of the material together with the carrier gas as mixed gas from the tank, to measure an absorbance of the material gas led out from the tank, to compare the measured absorbance and a previously-determined target absorbance, and to adjust the flow rate of the carrier gas introduced into the tank, so as to control the supply volume of the material gas.

By the way, recently, as the material used in the film formation treatment, a material with low vapor pressure has been used whose vaporization rate is slower than conventional materials and whose amounts of the material gas obtained by the vaporization is extremely small. However, when the material gas generated by vaporization of such a material with low vapor pressure is transferred by the conventional gas control system, the following problem occurs.

Figure 5:
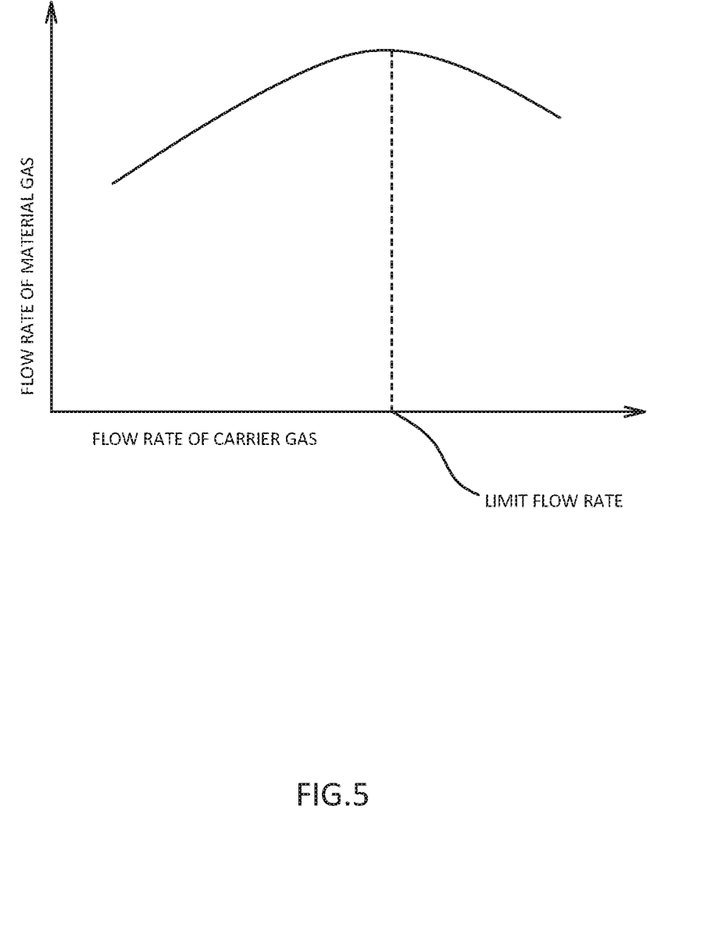
FIG. 5 is a graph showing change in the flow rate of the material gas when increase in the flow rate of the carrier gas is performed in the gas control system using only the carrier gas as a gas that transfers the material gas.

Before the explanation about the above-described problem, it is explained with a graph of FIG. 5 about changes in the flow rate of the material gas in the mixed gas when the flow rate of the carrier gas is increased in the conventional gas control system, thus in the gas control system in which the material gas is transferred only by the carrier gas. As the graph suggests, before the flow rate of the carrier gas reaches the limit flow rate, the flow rate of the material gas in the mixed gas also monotonously increases in accordance with increase in the flow rate of the carrier gas. However, after the flow rate of the carrier gas reaches the limit flow rate, the flow rate of the material gas in the mixed gas monotonously decreases in accordance with increase in the flow rate of the carrier gas. This phenomenon is caused by the circumstance where the vaporization rate of the material vaporized in the tank can not catch up with the flow rate of the carrier gas passing through the tank.

It should be noted that the above-described phenomenon would occur on any materials used in the film formation treatment. However, regarding the conventional material, the amount of the material gas obtained by vaporization is large, and the flow rate of the material gas in the mixed gas required for efficiently performing the film formation treatment is sufficiently secured even if the flow rate of the carrier gas is controlled to be extremely lower than the limit flow rate. Thus, the above-described phenomenon did not become a problem. However, regarding the above-described material with low vapor pressure, the amount of the material gas obtained by vaporization is extremely small, the flow rate of the carrier gas should be controlled to be around the limit flow rate, and the flow rate of the material gas in the mixed gas required for performing the film formation treatment should be efficiently secured as much as possible. Therefore, the above-described phenomenon would be a problem.

In other words, for example, it assumes in the conventional gas control system that the flow rate of the carrier gas is lower than the limit flow rate and increase in the flow rate of the material gas in the mixed gas is attempted by increase in the flow rate of the carrier gas. In that assumption, when the flow rate of the carrier gas reaches a flow rate around the limit flow rate, the first state occurs in which the increase amount of the flow rate of the material gas in the mixed gas becomes extremely lower with respect to the increase amount of the flow rate of the carrier gas. Furthermore, when the flow rate of the carrier gas becomes equal to or higher than the limit flow rate, the second state occurs in which the flow rate of the material gas in the mixed gas decreases even though increase in the flow rate of the carrier gas is performed. On the other hand, when decrease in the flow rate of the material gas in the mixed gas is attempted by decrease in the flow rate of the carrier gas in a condition where the flow rate of the carrier gas is higher than the limit flow rate, the third state occurs in which the flow rate of the material gas in the mixed gas increases even though decrease in the flow rate of the carrier gas is performed.

As is the case with the first state to the third state, the control limit state would continue for a long period in which a flow rate control with a predetermined performance level on the material gas cannot be performed and then, depending on the flow rate control of the carrier gas, instability might be caused on the flow rate of the material gas in the mixed gas so as to adversely affect the film formation treatment.

CITATION LIST

Patent Document

Patent Document 1: Japanese Unexamined Patent Application Publication No. H4-354131

SUMMARY OF INVENTION

Technical Problem

Thus, the present invention has a primary object of preventing the control limit state from being left for a long period in the gas control system that adjusts the flow rate of the carrier gas to control the flow rate of the material gas in the mixed gas.

Solution to Problem

In short, the gas control system according to the present invention is that is configured to introduce carrier gas into a tank in which a material is contained, and lead out material gas together with the carrier gas from the tank, the material gas generated by vaporization of the material, the gas control system comprising: a flow rate control unit that is configured to control a flow rate of the material gas led out from the tank by adjusting a flow rate of the carrier gas introduced into the tank; and a control limit detection unit that is configured to detect a control limit state and output detection of the control limit state, the control limit state is a state that adjustment of the flow rate of the carrier gas performed by the flow rate control unit cannot secure performing flow rate control of the material gas at a predetermined performance level.

As shown in FIG. 5, when increase in the flow rate of the carrier gas is performed in a condition where the flow rate of the carrier gas is sufficiently lower than the limit flow rate, the flow rate of the material gas increases in an approximate proportional manner. However, the above-described control limit state means a state in which the flow rate of the carrier gas and the flow rate of the material gas do not have such a relation, specifically, means the first state to the third state. It should be noted that the above-described control limit state changes due to several factors, such as composition of the material gas, the carrier gas or dilution gas.

Such a configuration makes it possible to rapidly detect the control limit state, when the flow rate of the carrier gas is adjusted. Thus, it is possible to prevent the control limit state from being left for a long period.

In addition, a specific configuration for detecting the control limit state would further comprise a flow rate relational data storage unit that is configured to store flow rate relational data in advance, the flow rate relational data showing relation between the flow rate of the carrier gas introduced into the tank and the flow rate of the material gas led out from the tank, wherein the control limit detection unit is configured to detect the control limit state by referring to the flow rate relational data to detect the control limit state. Specifically, flow rate relation stored in the flow rate relational data comprises a peak that changes from monotonic increase in which the flow rate of the material gas increases in accordance with increase in the flow rate of the carrier gas to monotonic decrease in which the flow rate of the material gas decreases in accordance with increase in the flow rate of the carrier gas, and wherein the control limit detection unit is configured to detect at least that the control limit state occurs, when the flow rate of the carrier gas introduced into the tank exceeds the peak.

The flow rate relational data is not limited if the flow rate relational data shows relation between the flow rate of the carrier gas introduced into the tank and the flow rate of the material gas led out from the tank. For example, it would be map data showing relation between the flow rate of the carrier gas and the flow rate of the material gas as shown in FIG. 5, and it would be a relational expression showing relation between the flow rate of the carrier gas and the flow rate of the material gas.

In such a configuration, it is possible by previously obtaining from the flow rate relational data the upper limit of the flow rate of the carrier gas causing the control limit state to rapidly detect the control limit state when the flow rate of the carrier gas exceeds the upper limit by the flow rate control unit adjusting the flow rate of the carrier gas.

In addition, another specific configuration for detecting the control limit state would further comprise a measurement unit that is configured to measure a flow rate index value that is a value directly or indirectly indicating the flow rate of the material gas, wherein occurrence of the control limit state might be detected, when the flow rate of the material gas indicated by the flow rate index value does not increase beyond the expected value after a predetermined period elapses since the flow rate control unit even increases the flow rate of the carrier gas. Specifically, occurrence of the control limit state might be detected, when the flow rate of the material gas indicated by the flow rate index value decreases after a predetermined period elapses since the flow rate control unit even increases the flow rate of the carrier gas. Additionally, in another specific configuration, occurrence of the control limit state might be detected, when the flow rate of the material gas indicated by the flow rate index value increases until a value (for example, not less than $\frac{1}{2}$, $\frac{1}{3}$, $\frac{1}{4}$, or the like of the above-described value supposed to be obtained) smaller than the value obtained in the case that the flow rate of the material gas indicated by the flow rate index value increases approximately in proportion to the increasing flow rate of the carrier gas after a predetermined period elapses since the flow rate control unit even increases the flow rate of the carrier gas. In this case, since the responsiveness is going down below the initial value, it is possible to implement the detection.

Such a configuration can lead accurate detection of the control limit state, even in the case that the flow rate of the carrier gas is increased, change in the flow rate of the material gas after a predetermined period is referred to be applied to the feedback control for detecting the control limit state. In other words, with respect to the feedback control, it is not always true that the flow rate of the material gas rapidly increases when the flow rate of the material gas decreases and then for increasing the flow rate the flow rate of the carrier gas is increased, for example. As described, a certain degree of time might be needed until the effect of increase in the flow rate of the carrier gas is reflected to increase in the flow rate of the material gas. However, even in such a case, it is possible to accurately detect only the occurrence of the control limit state by increasing the flow rate of the carrier gas and adjusting the length of the predetermined period in order to refer to change in the flow rate of the material gas after the predetermined period.

Additionally, in a gas control system including other specific configurations for detecting the control limit state, the flow rate control unit might be configured to compare the measurement flow rate index value measured by the measurement unit and the previously-determined target flow rate index value, and is configured to adjust the flow rate of the carrier gas introduced into the tank in such a manner that the measurement flow rate index value approaches the target flow rate index value. In this case, it is possible to make the flow rate of the mixed gas be stable if one is selected as the measurement unit is configured not to cause pressure difference in the mixed gas between the upstream side and the downstream side across the measurement unit, specifically that is not provided with a valve. It should be noted that a measuring instrument using the infrared absorbing method might be used as the measurement unit.

The flow rate index value might be just a flow rate of the material gas directly indicating the flow rate of the material gas, or partial pressure of the material gas indirectly indicating the flow rate of the material gas. It should be noted that the value indirectly indicating the flow rate of the material gas is not limited to the partial pressure of the material gas, and that a variable value following the flow rate of the material gas might be used.

Additionally, in each of the above-described gas control systems, gas in which dilution gas is added to the material gas and the carrier gas led out from the tank might be used as the mixed gas, and then the flow rate control unit might be configured to control the flow rate of the mixed gas by adjusting the flow rate of the dilution gas added to the material gas and the carrier gas led out from the tank. Specifically, the flow rate control unit might be configured to adjust either or both of the flow rate of the carrier gas and the flow rate of the dilution gas to make the measured total flow rate of the mixed gas, calculated on the basis of the flow rate of the carrier gas introduced into the tank and on the basis of the flow rate of the dilution gas added to the material gas and the carrier gas led out from the tank, in such a manner that be close to the predetermined target total flow rate of the mixed gas. Such a configuration can offset the change in the flow rate of the mixed gas caused by the change in the flow rate of the carrier gas with the change in flow rate of the dilution gas, and thus it is possible to make the flow rate of the mixed gas be stable.

In addition, the film formation apparatus according to the present invention is to supply the mixed gas to the film formation chamber by any one of the above-described gas control system.

The detection method for detecting the control limit state in the gas control system is also one of the present invention. In short, the detection method according to the present invention for detecting a control limit state is a detection method for detecting a control limit state of a flow rate of material gas in a gas control system where carrier gas is introduced into a tank containing a material and material gas generated by vaporization of the material is led out together with the carrier gas from the tank, the detection method comprising: controlling a flow rate of the material gas led out from the tank by adjusting a flow rate of the carrier gas introduced into the tank, and detecting a control limit state, in. Which adjustment of the flow rate of the carrier gas cannot secure performing flow rate control of the material gas at a predetermined performance level.

The program used in the gas control system is also one of the present invention. In short, the program according to the present invention is a program used for a gas control system where carrier gas is introduced into a tank containing a material and material gas generated by vaporization of the material is led out together with the carrier gas from the tank, the program making a computer exhibit functions of: controlling a flow rate of the material gas led out from the tank by adjusting a flow rate of the carrier gas introduced into the tank; and detecting a control limit state in which adjustment of the flow rate of the carrier gas cannot secure performing flow rate control of the material gas at a predetermined performance level, and outputting a fact of detection.

Advantageous Effects of Invention

According to the present invention configured as described above, when the flow rate of the carrier gas is changed, it is possible to rapidly detect the control limit state, and thus it is possible to prevent the control limit condition from being left for a long period.

REFERENCE SIGNS LIST 100, 200 Gas control system
10 Tank
20 Carrier gas introduction passage
21 Leading-out passage
22 Dilution gas introduction passage
30 Carrier gas flow rate adjustment unit
40 Dilution gas flow rate adjustment unit
50 Pressure measurement unit
60 Partial pressure measurement unit
70 Information processing device
71 Flow rate control unit
72 Control limit detection unit

DESCRIPTION OF EMBODIMENTS

Referring to figures, it is explained below about a gas control according to the present invention.

The gas control system of the present embodiment is used for supplying material gas at a stable flow rate, for example, in a film formation apparatus used for a semiconductor manufacturing process. Specifically, this is to lead out material gas with carrier gas inert gas, such as argon) from a tank, the material gas being obtained by vaporization of material with low vapor pressure (for example, halogenous material, such as aluminum chloride and tungsten chloride) in the tank, and to supply mixed gas in which dilution gas (inert gas, such as argon) is added to the material gas and the carrier gas led out from the tank.

Figure 1:
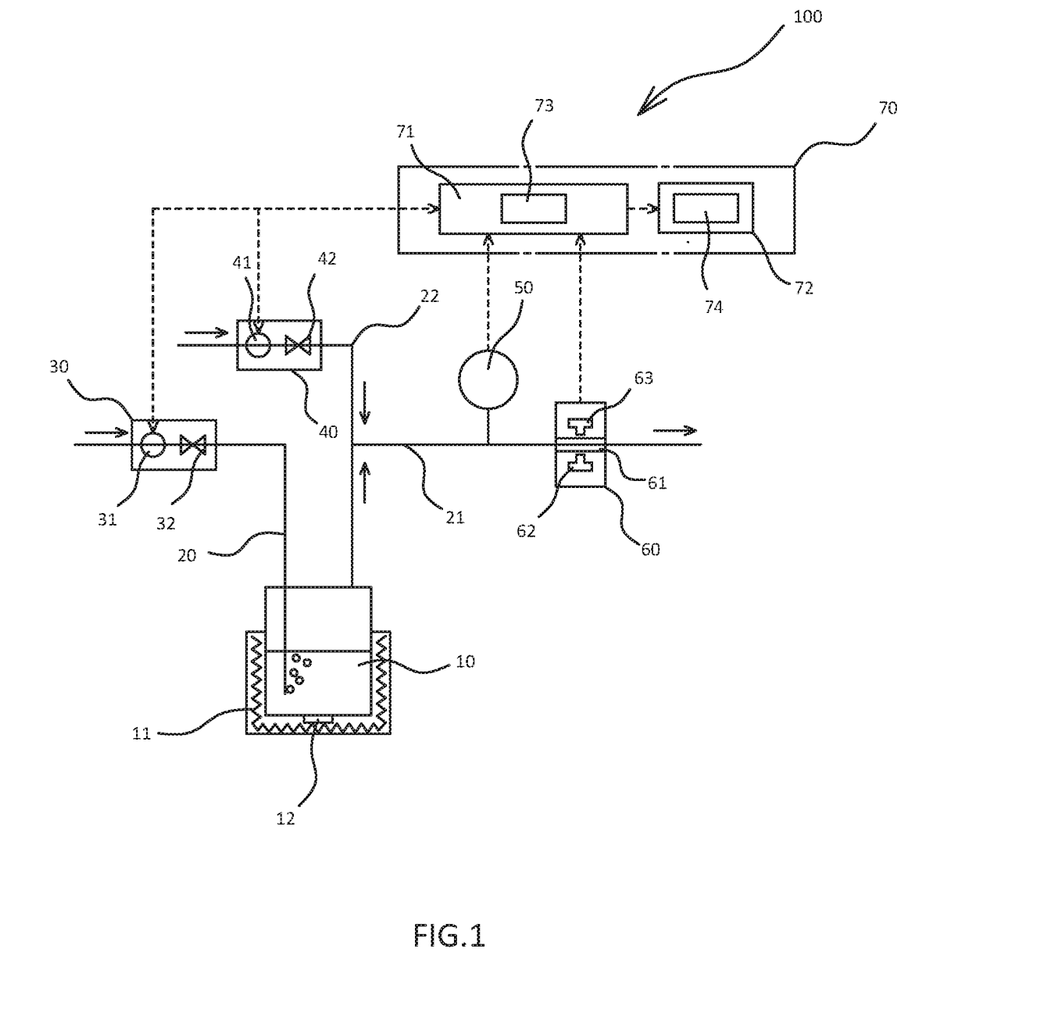
FIG. 1 is a schematic view showing a gas control system according to an embodiment of the present invention.

As shown in FIG. 1, the gas control system 100 of the present embodiment includes a tank 10 containing a material, a carrier gas introduction passage 20 for introducing carrier gas with respect to a liquid phase space of the tank 10, a leading-out passage 21 for leading out the material gas and the carrier gas from a gaseous phase space of the tank 10, a dilution gas introduction passage 22 for introducing dilution gas into the leading-out passage 21, a carrier gas flow rate adjustment unit 30 disposed on the carrier gas introduction passage 20, a dilution gas flow rate adjustment unit 40 disposed on the dilution gas introduction passage 22, a pressure measurement unit 50 and a partial pressure measurement unit 60 (measurement unit) disposed on the leading-out passage 21, and a information processing device 70 including a flow rate control unit 71 and control limit detection unit 72. It should be noted that, although not shown in figures, a starting end of the carrier gas introduction passage 20 is connected to a carrier gas supply mechanism, a starting end of the dilution gas introduction passage 22 is connected to a dilution gas supply mechanism, and a terminal of the leading-out passage 21 is connected to a film formation chamber supplying mixed gas. These configure the film formation apparatus.

The tank 10 is configured to heat the contained material by a heater 11 and to monitor a temperature in the tank 10 by a thermometer 12, so as to keep the temperature in the tank 10 at the previously-determined set temperature.

The carrier gas flow rate adjustment unit 30 is to adjust the flow rate of the carrier gas introduced to the tank 10, and is a so-called MFC (massflow controller). The carrier gas flow rate adjustment unit 30, mainly, includes a flow rate meter 31 for measuring the flow rate of the carrier gas flowing in the carrier gas introduction passage 20, and a valve 32 disposed at a downstream side from the flow rate meter 31 in the carrier gas introduction passage 20 and adjusting the opening degree to adjust the flow rate of the carrier gas introduced into the tank 10, compares the set flow rate sent from the flow rate control unit 71 and the measurement flow rate measured by the flow rate meter 31, adjusts the opening and closing of the valve 32 to equal both flow rates, and performs adjustment to flow the carrier gas into the carrier gas introduction passage 20 at the set flow rate sent from the flow rate control unit 71.

The dilution gas flow rate adjustment unit 40 is to adjust the flow rate of the dilution gas introduced into the leading-out passage 21, and is a so-called MFC (massflow controller). The dilution gas flow rate adjustment unit 40, mainly, includes a flow rate meter 41 for measuring the flow rate of the dilution gas flowing in the dilution gas introduction passage 22, and a valve 42 disposed at a downstream side from the flow rate meter 41 in the dilution gas introduction passage 22 and adjusting the opening degree to adjust the flow rate of the carrier gas joining to the leading-out passage 21, compares the set flow rate sent from the flow rate control unit 71 and the measurement flow rate measured by the flow rate meter 41, adjusts the opening and closing of the valve 42 to equal both flow rates, and performs adjustment to flow the dilution gas into the dilution gas introduction passage 22 at the set flow rate sent from the flow rate control unit 71.

The pressure measurement unit 50 is a pressure sensor, is disposed at a downstream side of the leading-out passage 21 from a position to which the dilution gas introduction passage 22 is connected, and measures pressure of the mixed gas flowing in the leading-out passage 21.

The partial pressure measurement unit 60 is an absorption-style partial pressure sensor, is disposed at a downstream side of the leading-out passage 21 from a position to which the dilution gas introduction passage 22 is connected, and measures partial pressure of the material gas in the mixed gas flowing in the leading-out passage 21. Specifically, the partial pressure measurement unit 60 is configured to pass the mixed gas, flowing in the leading-out passage 21, to a flow cell 61, is provided with a light source 62 disposed on one side across the flow cell 61, as well as provided with a light receiving unit 63 disposed on the other side, is configured to make the light receiving unit 63 receive light having been emitted from the light source 62 and having passed through the mixed gas flowing in the flow cell 61, and is configured to measure the partial pressure of the material gas in the mixed gas based on the intensity of light received by the light receiving unit 63. It should be noted that, in the present embodiment, the partial pressure of the material gas in the mixed gas measured by the partial pressure measurement unit 60 corresponds to the flow rate index value.

The information processing device 70 is a general-purpose or dedicated computer, stores predetermined program in a memory, and makes the CPU and the peripheral devices cooperate based on the program, so as to implement functions as the flow rate control unit 71 and the control limit detection unit 72. The flow rate control unit 71 refers to the partial pressure of the material gas in the mixed gas obtained from the partial pressure measurement unit 60, sends required set flow rates to both of the flow rate adjustment units 30, 40 to make the flow rate of the material gas in the mixed gas be close to the previously-determined target flow rate, and thus controls the flow rates of the carrier gas and the dilution gas. It should be noted that the flow rate control unit 71 is provided with an input unit 73, such as a touch panel, by which several information can be input. In addition, the control limit detection unit 72 is connected to the flow rate control unit 71, refers to information regarding the flow rate control at each period obtained from the flow rate control unit 71 and to the measured partial pressure measured by the partial pressure measurement unit 60 before and after the flow rate control, detects a control limit state, in which adjustment of the flow rate of the carrier gas performed by the flow rate control unit 71 cannot secure performing flow rate control of the material gas in the mixed gas at a predetermined performance level, and outputs the fact. It should be noted that the control limit detection unit 72 is provided with a display unit 74 capable of displaying a warning.

Figure 2:
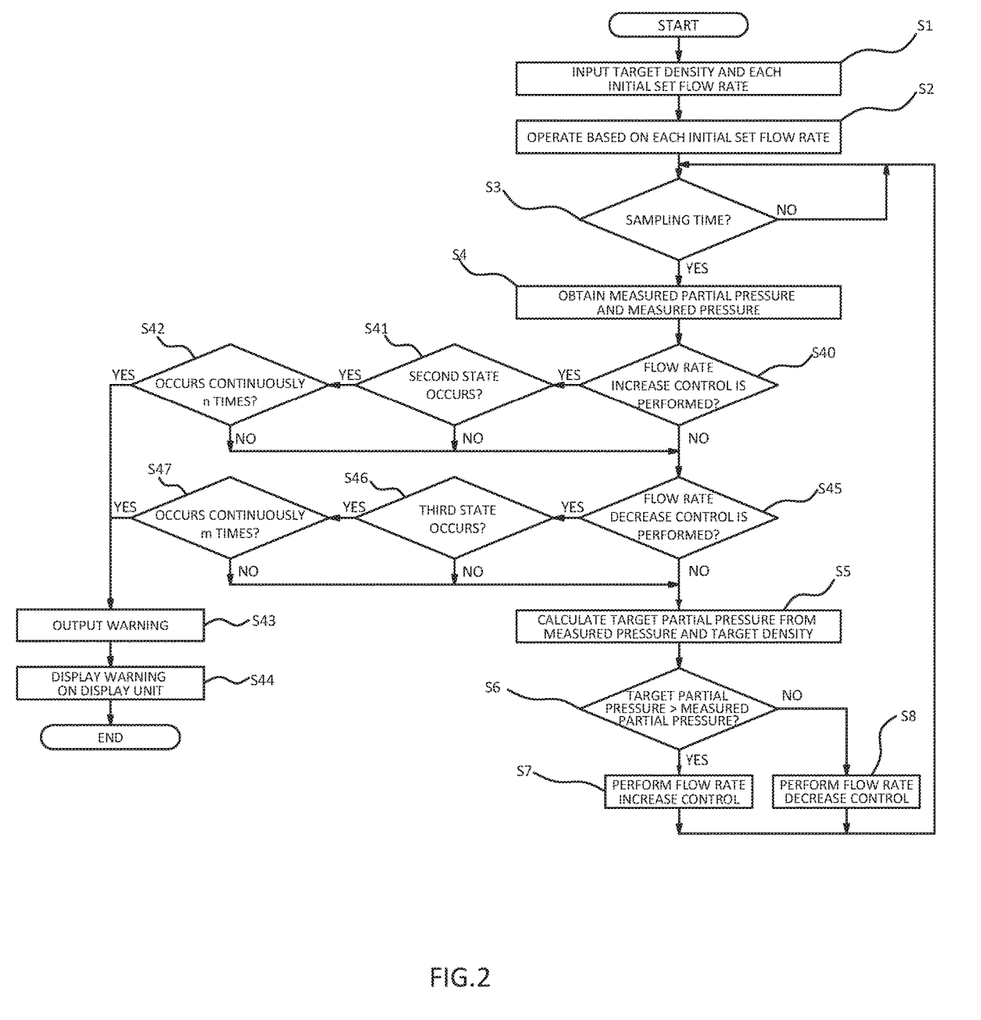
FIG. 2 is a flowchart showing an operating procedure of the gas control system according to the same embodiment.

Next, an operating procedure of the gas control system of the present embodiment is explained on the basis of the flowchart shown in FIG. 2.

Firstly, the input unit 73 is used to input each of the target density of the material gas in the mixed gas and the initial set flow rates of the carrier gas and the dilution gas into the flow rate control unit 71, which are optimal for the film formation treatment (Step S1). It should be noted that, with respect to each of the initial set flow rates, it is preferred to lead out the optimal flow rates from map data (see FIG. 5) obtained before the film formation treatment and representing relation between the flow rate of the carrier gas introduced into the tank 10 and the flow rate of the material gas led out from the tank 10. If the initial set flow rates of the carrier gas and the dilution gas are determined with the map data, it is possible to rapidly increase the flow rate of the material gas in the mixed gas to the optimal flow rate at the time when the gas control system is operated. It should be noted that the map data might be obtained in advance with materials having the same compositions and with the same gas control system. In addition, when the film formation treatment is repeatedly performed with materials having the same compositions and with the same gas control system, the map data obtained at the previous film formation treatment might be used. It should be noted that the control limit state detected by the control limit detection unit 72 is determined on the basis of the initial set flow rates of the carrier gas and dilution gas having been input from the input unit 73.

Next, the flow rate control unit 71 sends the initial set flow rate of the carrier gas to the carrier gas flow rate adjustment unit 30 and also sends the initial set flow rate of the dilution gas to the dilution gas flow rate adjustment unit 40. Thus, the carrier gas flow rate adjustment unit 30 adjusts to make the flow rate of the carrier gas flowing in the carrier gas introduction passage 20 be equal to the initial set flow rate, and further the dilution gas flow rate adjustment unit 40 adjusts to make the flow rate of the dilution gas flowing in the dilution gas introduction passage 22 be equal to the initial set flow rate. As the results, each gas starts flowing in the gas control system 100 (Step S2).

Next, when the mixed gas passes through the pressure measurement unit 50 and the partial pressure measurement unit 60, at a fixed period (Step S3) the pressure measurement unit 50 measures the pressure of the mixed gas flowing in the leading-out passage 21, and further the partial pressure measurement unit 60 measures the partial pressure of the material gas in the mixed gas flowing in the leading-out passage 21 (Step S4).

Next, the flow rate control unit 71 receives the measured pressure measured by the pressure measurement unit 50 and the measured partial pressure (measurement flow rate index value) measured by the partial pressure measurement unit 60, uses the measured pressure and the target density, and calculates with formula (1) the target partial pressure (target flow rate index value) of the material gas in the mixed gas required for the assumption that the material gas in the mixed gas flowing in the leading-out passage 21 was at the target density (Step S5).

$$P_{vapor\ set} = C \times P_{total} \tag{1}$$

It should be noted that $P_{vapor\ set}$ represents the target partial pressure of the material gas in the mixed gas, C represents the target density of the material gas in the mixed gas, and $P_{total}$ represents pressure of the mixed gas.

Next, the flow rate control unit 71 compares the measured partial pressure and the target partial pressure (Step S6). When the measured partial pressure is lower than the target partial pressure, it sends the set flow rate to the carrier gas flow rate adjustment unit 30 that is to increase the flow rate of the carrier gas flowing in the carrier gas introduction passage 20, and further sends the set flow rate to the dilution gas flow rate adjustment unit 40 that is to decrease the flow rate of the dilution gas flowing in the dilution gas introduction passage 22. Thus, the flow rate increase control is performed to make the flow rate of the material gas in the mixed gas flowing in the leading-out passage 21 be close to the optimal flow rate, in which the carrier gas flow rate adjustment unit 30 adjusts to make the flow rate of the carrier gas flowing in the carrier gas introduction passage 20 be equal to the set flow rate and further the dilution gas flow rate adjustment unit 40 adjusts to make the flow rate of the dilution gas flowing in the dilution gas introduction passage 22 be equal to the set flow rate (Step S7). On the other hand, when the measured partial pressure is higher than the target partial pressure, a set flow rate for decreasing the flow rate of the carrier gas flowing in the carrier gas introduction passage 20 is sent to the carrier gas flow rate adjustment unit 30, and further a set flow rate for increasing the flow rate of the dilution gas flowing in the dilution gas introduction passage 22 is sent to the dilution gas flow rate adjustment unit 40. Thus, the flow rate decrease control is performed to make the flow rate of the material gas in the mixed gas flowing in the leading-out passage 21 be close to the optimal flow rate, in which the carrier gas flow rate adjustment unit 30 adjusts to make the flow rate of the carrier gas flowing in the carrier gas introduction passage 20 be equal to the set flow rate and further the dilution gas flow rate adjustment unit 40 adjusts to make the flow rate of the dilution gas flowing in the dilution gas introduction passage 22 be equal to the set flow rate (Step S8).

In addition, the control limit detection unit 72 performs the following operations between Step S4 and Step S5. More specifically; it firstly determines whether or not the flow rate increase control has been performed at the previous period (Step S40). When it determines that the flow rate increase control has been performed at the previous period, it compares the measured partial pressure measured at the previous period by the partial pressure measurement unit 60 immediately before the flow rate increase control is performed and the measured partial pressure measured at the current period by the partial pressure measurement unit immediately after the flow rate increase control is performed, so as to determine whether or not the second state occurs in which the measured partial pressure at the previous period is higher than the measured partial pressure at the current period (Step S41). When it determines that the second state occurs, it determines whether or not the second state has occurred continuously n times (Step S42). When the second state has occurred continuously n times, it determines that the control limit state has occurred and it outputs the fact (Step S43), to display the warning on the display unit 74 (Step S44). On the other hand, at Step S40, when it determines that the flow rate increase control has not been performed at the previous period, it determines whether or not the flow rate decrease control has been performed at the previous period (Step S45). When it determines that the flow rate decrease control has been performed at the previous period, it compares the measured partial pressure measured at the previous period by the partial pressure measurement unit 60 immediately before the flow rate decrease control is performed and the measured partial pressure measured at the current period by the partial pressure measurement unit immediately after the flow rate decrease control is performed, so as to determine whether or not the third state occurs in which the measured partial pressure at the previous period is lower than the measured partial pressure at the current period (Step S46).

When it determines that the third state occurs, it determines whether or not the third state has occurred continuously m times (Step S47). When the third state has occurred continuously m times, it determines that the control limit state has occurred and it outputs the fact (Step S43), to display the warning on the display unit 74 (Step S44).

It should be noted that, after the warning is displayed on the display unit 74 at Step S44, the gas control system might be stopped automatically or a worker having confirmed the warning displayed on the display unit 74 might manually stop the gas control system, in order to prevent the same state from lasting more. Further, instead of or in addition to the operation between Step S4 and Step S5, an operation might be performed which determines that the control limit state has occurred even when increase in the flow rate of the carrier gas is performed and, after a predetermined period (for example, after x period, x being a predetermined integer), the measured partial pressure increases until a value smaller than the value obtained in the case that the measured partial pressure is increased approximately in proportion to the increasing flow rate of the carrier gas (for example, not more than ½, ⅓, ¼, or the like of the above-described value supposed to be obtained), while determines that the control limit state has occurred even when decrease in the flow rate of the carrier gas is performed and, after a predetermined period (for example, after y period, y being a predetermined integer), the measured partial pressure decreases until a value larger than the value obtained in the case that the measured partial pressure is decreased approximately in proportion to the decreasing flow rate of the carrier gas (for example, not less than ½, ⅓, ¼, or the like of the above-described value supposed to be obtained).

It should be noted that, at Step 1, it might uses the input unit 91 to input the target total flow rate of the mixed gas optimal for the film formation treatment into the flow rate control unit 71, and in the flow rate control at Step S7 and Step S8 the set flow rates of the carrier gas and dilution gas might be determined to make the flow rate of the mixed gas be equal to the target total flow rate when increase or decrease in the flow rates of the carrier gas and dilution gas is performed.

Specifically, the flow rate control unit 71 receives the measured pressure measured by the pressure measurement unit 50 and the measured partial pressure measured by the partial pressure measurement unit 60, further receives the set flow rate of the carrier gas set by the carrier gas flow rate adjustment unit and the set flow rate of the dilution gas set by the dilution gas flow rate adjustment at the time when these measured values are measured. In the flow rate control at Step S7 and Step S8, it uses the measured pressure, the measured partial pressure, the set flow rate of the carrier gas, and the set flow rate of the dilution gas, calculates the calculated total flow rate of the mixed gas with formula (2), and determines the set flow rates of the carrier gas and dilution gas to make the calculated total flow rate of the mixed gas be equal to the target total flow rate of the mixed gas.

$$Q \text{ total} = (Q_c + Q_d)/(1 - P \text{ vapor } ir/P \text{ total}) \qquad (2)$$

It should be noted at $Q_{total}$ represents the calculated total flow rate of the mixed gas, $Q_c$ represents the set flow rate of the carrier gas, $Q_d$ represents the set flow rate of the dilution gas, $P_{vapor\ ir}$ represents the measured partial pressure of the material gas in the mixed gas, and the $P_{total}$ represents the pressure (total pressure) of the mixed gas.

In the present embodiment, both of the flow rate of the carrier gas and the flow rate of the dilution gas are increased and decreased when the flow rate control is performed. However, it is possible to increase and decrease only one of them for performing the flow rate control. Additionally, in the present embodiment, it determines at each fixed period whether or not the second state and the third state occur. When either state continues n, m times (n, m period), it determines that the control limit state occurs and outputs the fact. However, it is possible to monitor whether or not the second state or the third state occurs, determine that the control limit state occurs when either state lasts for t hours, and output the fact. Additionally, in the present embodiment, it is provided with the partial pressure measurement unit as the measurement unit and treats the partial pressure of the material gas in the mixed gas as the flow rate index value, without being limited by them. For example, it might be provided with a density sensor and treats the density of the material gas in the mixed gas as the flow rate index value. It might use another sensor that measures a value indirectly representing the flow rate of the material gas in the mixed gas.

Another Embodiment

Figure 3:
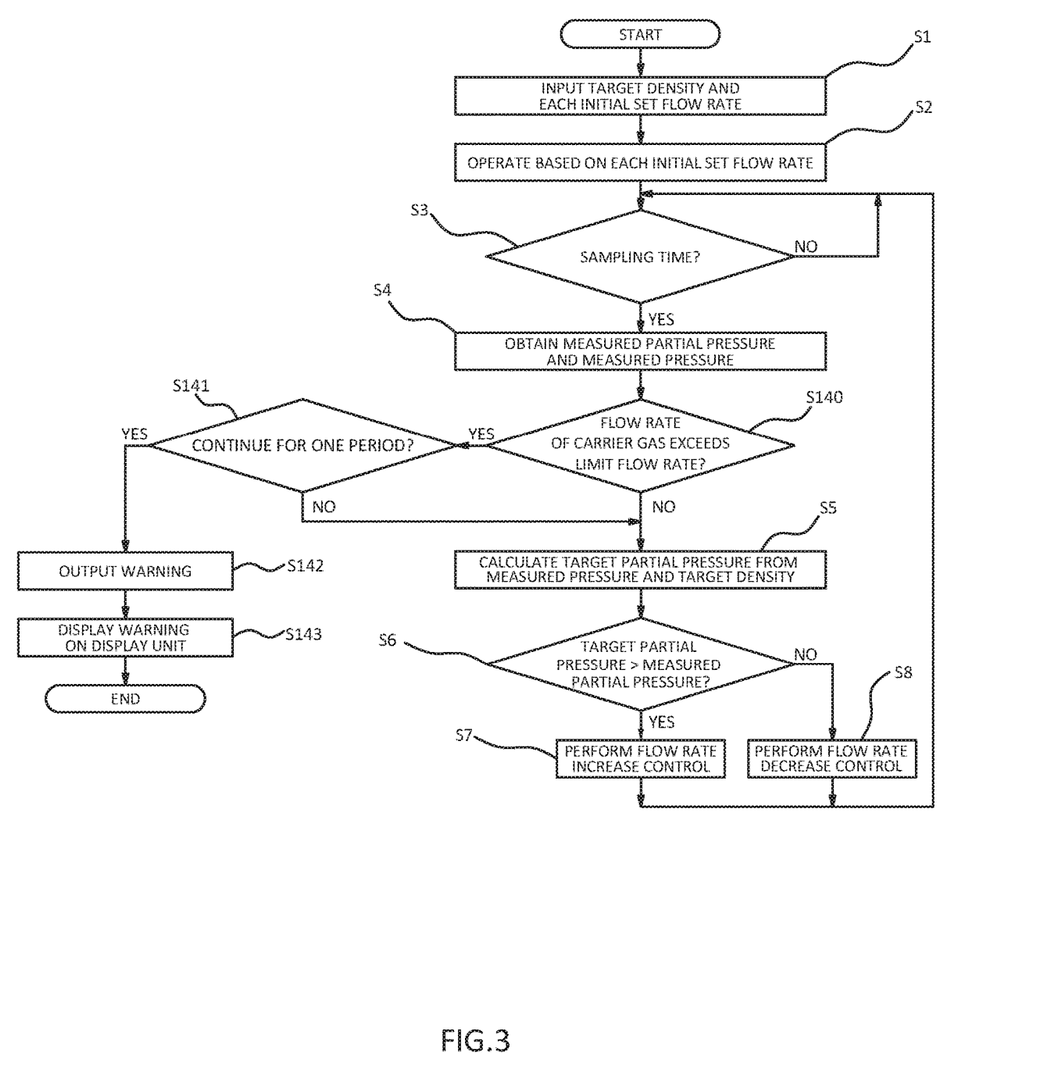
FIG. 3 is a flowchart showing an operating procedure of a gas control system according to another embodiment.

For example, a gas control system is also contained within the present invention, which includes the same configurations as the gas control system 100 shown in FIG. 1, except that the control limit detection unit is connected to a flow rate relational data storage unit storing map data (flow rate relational data) showing relation between the flow rate of the carrier gas previously introduced into the tank 10 and the flow rate of the material gas led out from the tank 10, and which operates with the procedure of the flowchart shown in FIG. 3.

In this gas control system, as FIG. 3 suggests, operations at Step S1, at Step S4, and between Step S4 and Step S5 are different from operations of the gas control system 100. More specifically, in this gas control system, at Step S1, the target density of the material gas in the mixed gas and the initial set flow rates of the carrier gas and the dilution gas are input, further the map data stored in the flow rate relational data storage unit are referred, and thus the limit flow rate of the carrier gas is obtained. Then, at Step S4, the measured pressure measured by the pressure measurement unit 50 and the measured partial pressure measured by the partial pressure measurement unit 60 are obtained, and further the flow rate of the carrier gas at the time when the measured pressure and the measured partial pressure are measured is obtained from the carrier gas flow rate adjustment unit 30. Then, the following operation is performed between Step S4 and Step S5. In short, it determines Whether or not the flow rate of the carrier gas exceeds the limit flow rate (Step S140). When it determines that the flow rate of the carrier gas exceeds the limit flow rate, it determines whether or not the flow rate of the carrier gas exceeds the limit flow rate continuously for one period (Step S141). When it determines that the flow rate of the carrier gas exceeds the limit flow rate continuously for one period, it determines that the control limit state has occurred, and it outputs the fact (Step S142), to display the warning on the display unit 74 (Step S143).

It should be noted that, in this gas control system, the limit flow rate of the carrier gas is used as the index for determining whether or not the control limit state occurs. However, it is possible as the index to use a flow rate around the limit flow rate at which the increase amount of the flow rate of the material gas in the mixed gas becomes extremely lower with respect to the increase amount of the flow rate of the carrier gas.

Figure 4:
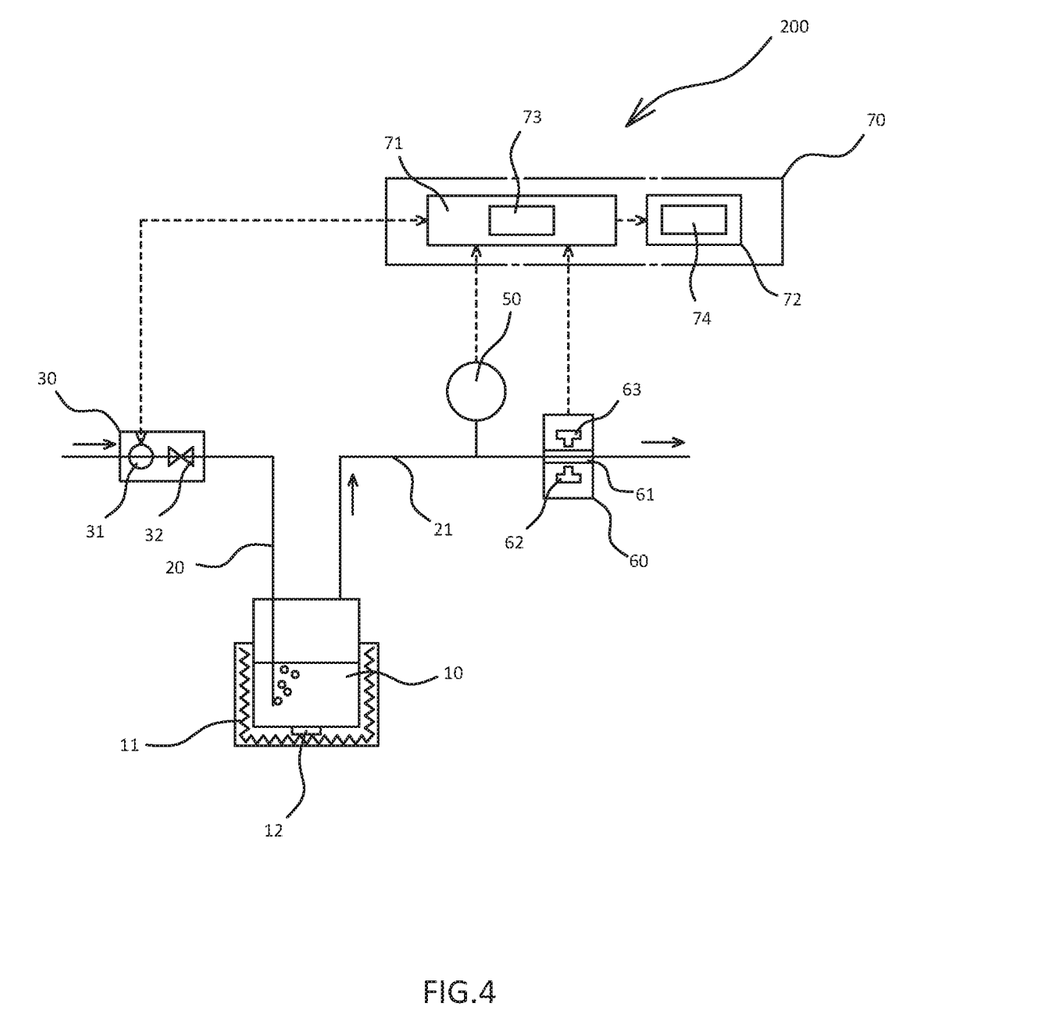
FIG. 4 is a schematic view showing the gas control system according to another embodiment.

In addition, for example, as shown in FIG. 4, the gas control system 200 is also contained within the present invention in which the dilution gas introduction passage 22 included in the gas control system 100 according to the previous embodiment is deleted and in which only the carrier gas introduced into the tank 10 through the carrier gas introduction passage 20 is used to transfer the material gas generated by vaporization of the material in the tank. It should be noted that the gas control system 200 includes similar configurations to the gas control system 100, except that the dilution gas introduction passage 22 and the dilution gas flow rate adjustment unit disposed on the dilution gas introduction passage 22 are deleted from the gas control system 100 according to the previous embodiment. Therefore, the measurement object of the pressure measurement unit 50 and the partial pressure measurement unit 60 is the mixed gas composed of the carrier gas and material gas led out from the tank 10 through the leading-out passage 21. In this embodiment, since the density control of the material gas in the mixed gas needs to be performed only by increase and decrease in the flow rate of the carrier gas, the possibility to make the flow rate of the carrier gas be in the control limit state is enhanced higher than the gas control system 100 according to the previous embodiment, and thus the importance of the detection function according to the present invention is increased.

It should be noted that, in each of the above-described embodiments, the warning is displayed on the display unit after the control limit state is detected. However, it is possible to dispose a speaker so as to issue the warning sound.

Additionally, in each of the above-described embodiments, a bubbler-type (bubbling-type) gas control system is explained. However, the gas control system according to the present invention can be applied to a DLI-type gas control system, in which the material is transferred in liquid condition, and vaporized near the use point (for example, film formation chamber) so that the flow rate control is performed. In this case, a tank might be disposed near the use point, the carrier gas might be introduced into the tank, and the material gas vaporized in the tank might be led out from the tank together with the carrier gas.

Additionally, in each of the above-described embodiments, the valves 32, 42 are disposed as the carrier gas flow rate adjustment unit 30 and the dilution gas flow rate adjustment unit 40 at the downstream side of the flow rate meters 31, 41. However, the valves 32, 42 might be disposed at the upstream side of the flow rate meters 31, 41.

INDUSTRIAL APPLICABILITY

In the gas control system adjusting the flow rate of the carrier gas to control the flow rate of the material gas in the mixed gas, it prevents the control limit state from being left for a long period.

The invention claimed is:
1. A gas control system, comprising:
a tank in which a material is contained;
a carrier gas introduction passage that is configured to introduce a carrier gas into the tank;
a leading out passage that is configured to lead out mixed gas from the tank, wherein the mixed gas includes a material gas generated by vaporization of the material and the carrier gas;
a carrier gas flow rate adjuster disposed on the carrier gas introduction passage and that is configured to adjust a flow rate of the carrier gas introduced into the tank, and the carrier gas flow rate adjuster has a flow meter and a valve;

a flow rate controller that is configured to control a flow rate of the material gas led out from the tank in such a manner that a concentration of the material gas in the mixed gas matches a target concentration by changing the setting of the carrier gas flow rate adjuster and adjusting the flow rate of the carrier gas introduced into the tank; and a control limit detector that is configured to detect a control limit state that includes at least a state in which the flow rate of the material gas in the mixed gas decreases while the flow rate of the carrier gas increases or a state in which the flow rate of the material gas in the mixed gas increases while the flow rate of the carrier gas decreases;

wherein the control limit detector is configured to obtain information related to the flow rate of the carrier gas and information related to the flow rate of the material gas and to compare each information so as to detect the control limit state or the control limit detector is configured to obtain the information of the flow rate of the carrier gas and judge whether the flow rate of the carrier gas exceeds a limit flow rate that is a pre-acquired flow rate of the carrier gas, thereby detecting the control limit state.

2. The gas control system according to claim 1, further comprising:

a flow rate relational data store that is configured to store flow rate relational data in advance, the flow rate relational data showing relation between the flow rate of the carrier gas introduced into the tank and the flow rate of the material gas led out from the tank, wherein the control limit detector is configured to detect the control limit state by referring to the flow rate relational data and obtaining the limit flow rate and comparing the limit flow rate with a set flow rate of the carrier gas that the flow rate controller sends to the carrier gas flow rate adjuster.

3. The gas control system according to claim 2, wherein flow rate relation stored in the flow rate relational data comprises a peak that changes from monotonic increase in which the flow rate of the material gas increases in accordance with increase in the flow rate of the carrier gas to monotonic decrease in which the flow rate of the material gas decreases in accordance with increase in the flow rate of the carrier gas, and wherein the control limit detector is configured to detect at least that the control limit state occurs, when the flow rate of the carrier gas introduced into the tank exceeds the peak.

4. The gas control system according to claim 1, further comprising:

a measurer that is configured to measure a flow rate index value that is a value directly or indirectly indicating the flow rate of the material gas, wherein occurrence of the control limit state is detected by the control limit detector when the flow rate of the material gas indicated by the flow rate index value does not increase beyond the expected value after a predetermined period elapses since the flow rate controller increases the flow rate of the carrier gas.

5. The gas control system according to claim 4, wherein occurrence of the control limit state is detected by the control limit detector when the flow rate of the material gas indicated by the flow rate index value decreases after a predetermined period elapses since the flow rate controller increases the flow rate of the carrier gas.

6. The gas control system according to claim 4, wherein the flow rate controller is configured to compare a measurement flow rate index value measured by the measurer and a predetermined target flow rate index value, and is configured to adjust the flow rate of the carrier gas introduced into the tank in such a manner that the measurement flow rate index value approaches the target flow rate index value.

7. The gas control system according to claim 4, wherein the measurer comprises:

a light source that is disposed outside of the leading out passage and that is configured to emit light into the leading out passage; and a light receiver that is disposed outside of the leading out passage and that is configured to receive the light passing through the leading out passage.

8. The gas control system according to claim 1, further comprising:

a dilution gas introduction passage that is connected to the leading out passage and that is configured to add a dilution gas to the material gas and the carrier gas led out from the tank, and a dilution gas flow rate adjuster disposed on the dilution gas introduction passage and that is configured to adjust a flow rate of the dilution gas introduced to the leading out passage, and the dilution gas flow rate adjuster has a flow meter and a valve;

wherein the flow rate controller is configured to control the flow rate of the mixed gas that includes the material gas, the carrier gas and the dilution gas by changing the setting of the dilution gas flow rate adjuster and adjusting a flow rate of the dilution gas added to the material gas.

9. The gas control system according to claim 8, wherein the flow rate controller is configured to adjust either or both of the flow rate of the carrier gas and the flow rate of the dilution gas in such a manner that a measured total flow rate of the mixed gas approaches a predetermined target total flow rate of the mixed gas, the measured total flow rate of the mixed gas is calculated on the basis of the flow rate of the carrier gas introduced into the tank and a flow rate of dilution gas added to the material gas and the carrier gas led out from the tank.

10. A film formation apparatus that is configured to supply mixed gas to a film formation chamber by the gas control system according to claim 1.

11. A detection method for detecting a control limit state of a flow rate of material gas in a gas control system, the method comprising:

providing a tank containing a material;

providing a carrier gas introduction passage that is configured to introduce a carrier gas into the tank;

providing a leading out passage that is configured to lead out mixed gas from the tank, wherein the mixed gas includes material gas generated by vaporization of the material and the carrier gas;

providing a carrier gas flow rate adjuster disposed on the carrier gas introduction passage and that is configured to adjust a flow rate of the carrier gas introduced to the tank, and the carrier gas flow rate adjuster has a flow meter and a valve;

controlling a flow rate of the material gas led out from the tank in such a manner that a concentration of the material gas in the mixed gas matches a target concentration by changing the setting of the carrier gas flow rate adjuster and adjusting the flow rate of the carrier gas introduced into the tank; and detecting a control limit state that includes at least a state in which the flow rate of the material gas in the mixed gas decreases while the flow rate of the carrier gas increases or a state in which the flow rate of the material gas in the mixed gas increases while the flow rate of the carrier gas increases;

wherein obtaining information related to the flow rate of the carrier gas and information related to the flow rate of the material gas and comparing each information so as to detect the control limit state or obtaining the information of the flow rate of the carrier gas and judging whether the flow rate of the carrier gas exceeds a limit flow rate that is a pre-acquired flow rate of the carrier gas, thereby detecting the control limit state.

12. A non-transitory computer-readable medium containing a program used for a gas control system, the gas control system having: a tank containing a material; a carrier gas introduction passage that is configured to introduce a carrier gas into the tank; a leading out passage that is configured to lead out mixed gas from the tank, wherein the mixed gas includes material gas generated by vaporization of the material and the carrier gas; and a carrier gas flow rate adjuster disposed on the carrier gas introduction passage and that is configured to adjust a flow rate of the carrier gas introduced into the tank, and the carrier gas flow rate adjuster has a flow meter and a valve, the program making a computer exhibit functions of:

controlling a flow rate of the material gas led out from the tank in such a manner that a concentration of the material gas in the mixed gas matches a target concentration by changing the setting of the carrier gas flow rate adjuster and adjusting the flow rate of the carrier gas introduced into the tank; and detecting a control limit state that includes at least a state in which the flow rate of the material gas in the mixed gas decreases while the flow rate of the carrier gas increases or a state in which the flow rate of the material gas in the mixed gas increases while the flow rate of the carrier gas decreases;

wherein obtaining information related to the flow rate of the carrier gas and information related to the flow rate of the material gas and comparing each information so as to detect the control limit state or obtaining the information of the flow rate of the carrier gas and judging whether the flow rate of the carrier gas exceeds a limit flow rate that is a pre-acquired flow rate of the carrier gas, thereby detecting the control limit state.

\* \* \* \* \*